Aug. 10, 1971 P. D. DAVIDSE 3,598,710

ETCHING METHOD

Filed April 4, 1966 3 Sheets-Sheet 1

INVENTOR
PIETER D. DAVIDSE

BY George D. Saile
ATTORNEY

Aug. 10, 1971 P. D. DAVIDSE 3,598,710

ETCHING METHOD

Filed April 4, 1966 3 Sheets-Sheet 2

3,598,710
ETCHING METHOD

Pieter D. Davidse, Poughkeepsie, N.Y., assignor to International Business Machines Corporation, Armonk, N.Y.

Filed Apr. 4, 1966, Ser. No. 540,054
Int. Cl. C23c *15/00*
U.S. Cl. 204—192 5 Claims

ABSTRACT OF THE DISCLOSURE

The object to be sputter etched is excited in a reduced atmosphere of inert gas by an alternation RF potential which is supplied through a capacitive coupling circuit to set up a glow discharge around the object. During those periods when the alternating RF potential biases the object negative with respect to this glow discharge, the object attracts positive ions to perform this sputter etching. During the intervening period, when the alternating RF potential biases the object positive, electrons are attracted to the target. Under these conditions, sputter etching will continue without the accumulation of a positive charge around the object being etched. Therefore, it is not necessary to maintain the large conductive surface at a negative potential with an electrical connection to an outside source of electrical energy. Even minute quantities of such dielectric materials can be removed from small chemically etched holes which are to ultimately be locations for electrical contacts to semiconductor devices.

This invention relates to etching and more particularly to a method for cleaning semiconductor devices of undesirable materials by RF sputter etching techniques.

There are applications, particularly in the manufacture of semiconductor devices, where the results of conventional chemical etching have proven not completely satisfactory, sputter etching can be employed. In such situations it may be advantageous to use sputter etching alone or in combination with chemical etching. Where both techniques are successively utilized the chemical etching is used to initially take off the bulk quantities of material to be removed, followed by sputtering to completely remove the remaining small quantities of material.

In sputter etching, material is removed from an object by the bombardment of the object with high energy ions that are directed through a mask defining the pattern to be etched in the object. The sputter etching method used prior to the present invention involves the placing of the object to be etched covered by a mask in a reduced atmosphere of an inert gas such as argon and there maintaining the object and the mask at a negative DC potential that will ionize the gas atoms and set up an ion sheath (Crookes Dark Space) around the object and the mask. This ion sheath contains high energy positive ions that bombard the material through the mask to perform the sputter etching.

The difficulty with the described method of sputter etching is that the ions tend to collect around the object to be etched after they have bombarded the object and have expended their energy. If their charge is not neutralized, these collecting ions will build up into a positively charged layer around the object which shields the object from further bombardment by the high energy ions from the ion sheath. Therefore, in order for the sputtering to continue, it is necessary to neutralize the ions that collect around the object to be etched. If the object to be etched is metal, the maintenance of the metal at the negative potential required for sputtering will cause the ions to be neutralized by secondary electrons emitted from the metal. If the object to be etched is a poor conductor or a dielectric, neutralization may be accomplished by employing a metal mask which is maintained at the negative potential required for sputtering so that the ions can be neutralized by secondary electrons emitted from the metal mask. However, the presence of this metal mask promotes a "halo" pattern of redeposited dielectric material and conductive materials from the mark and other fixures surrounding areas of the object which is being DC sputter cleaned. The pattern is undesirable because it can cause shorting across the surface and interfere with subsequent soldering steps.

Further, it should be apparent that these techniques for charge neutralization require maintaining a large conductive surface exposed to the ion bombardment at a negative potential with an electrical connection to an outside source of electrical energy. In many applications this is not possible and in other applications it is not desirable.

It is thus an object of the present invention to provide a new method of sputter etching.

It is another object of this invention to provide a more universally applicable method for sputter etching dielectric surfaces without the use of a mask of any kind.

It is still another object of the present invention to provide a satisfactory method for sputter cleaning residual oxide from chemically etched holes in an article which expose a semiconductor surface.

In accordance with the present invention, the object to be sputter etched is excited in a reduced atmosphere of inert gas by an alternating RF potential which is applied through a capacitive coupling circuit to set up a glow discharge around the object. During those periods when the alternating RF potential biases the object negative with respect to this glow discharge, the object attracts positive ions to perform the sputter etching. During the intervening periods, when the alternating RF potential biases the object positive, electrons are attracted to the target. At the frequency of the RF source, more electrons than ions are attached to the object because of the greater mobility of the electrons. These electrons neutralize any positive ions that accumulate around the object during sputter etching. The electrons also cause the object to become negatively biased because the capacitive coupling circuit through which the alternating RF potential is applied will not pass DC current to neutralize the excess of electrons.

Under the above conditions, sputter etching will continue without the accumulation of a positive charge around the object being etched. Therefore, it is not necessary with the present invention to maintain a large conductive surface at a negative potential with an electrical connection to an outside source of electrical energy. As a result, dielectric surfaces can be rapidly and effectively cleaned by sputtering. Even minute quantities of such dielectric materials can be removed from small chemically etched holes which are to ultimately be the locations for electrical contact to semiconductor devices.

The foregoing and other objects, features and advantages of the invention will be apparent from the following more particular description of a preferred embodiment of the invention, as illustrated in the accompanying drawings of which:

Figure 1:
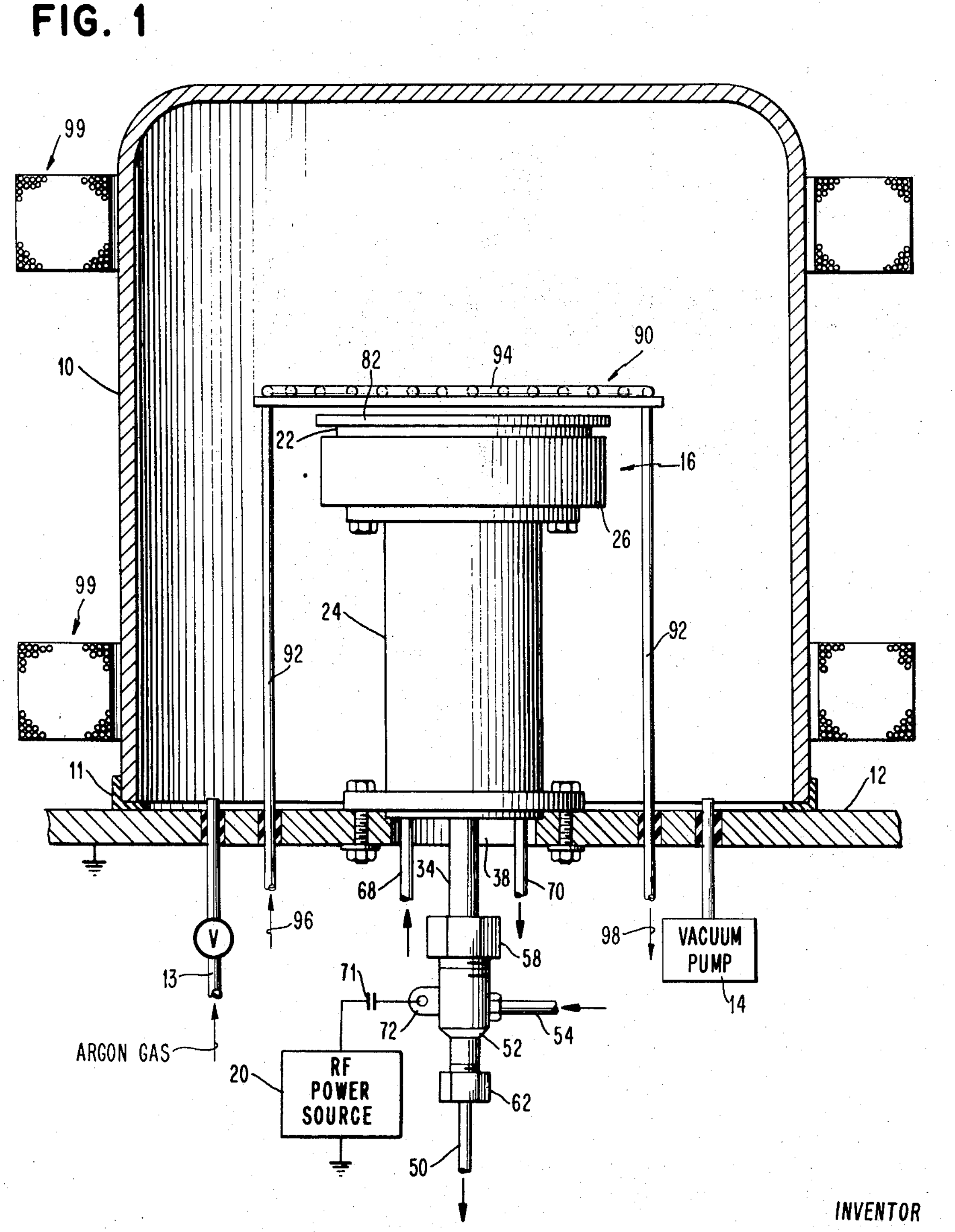
FIG. 1 is a vertical view, partly in section, of a dielectric sputtering apparatus which can be employed in using the present invention.
Figure 2:
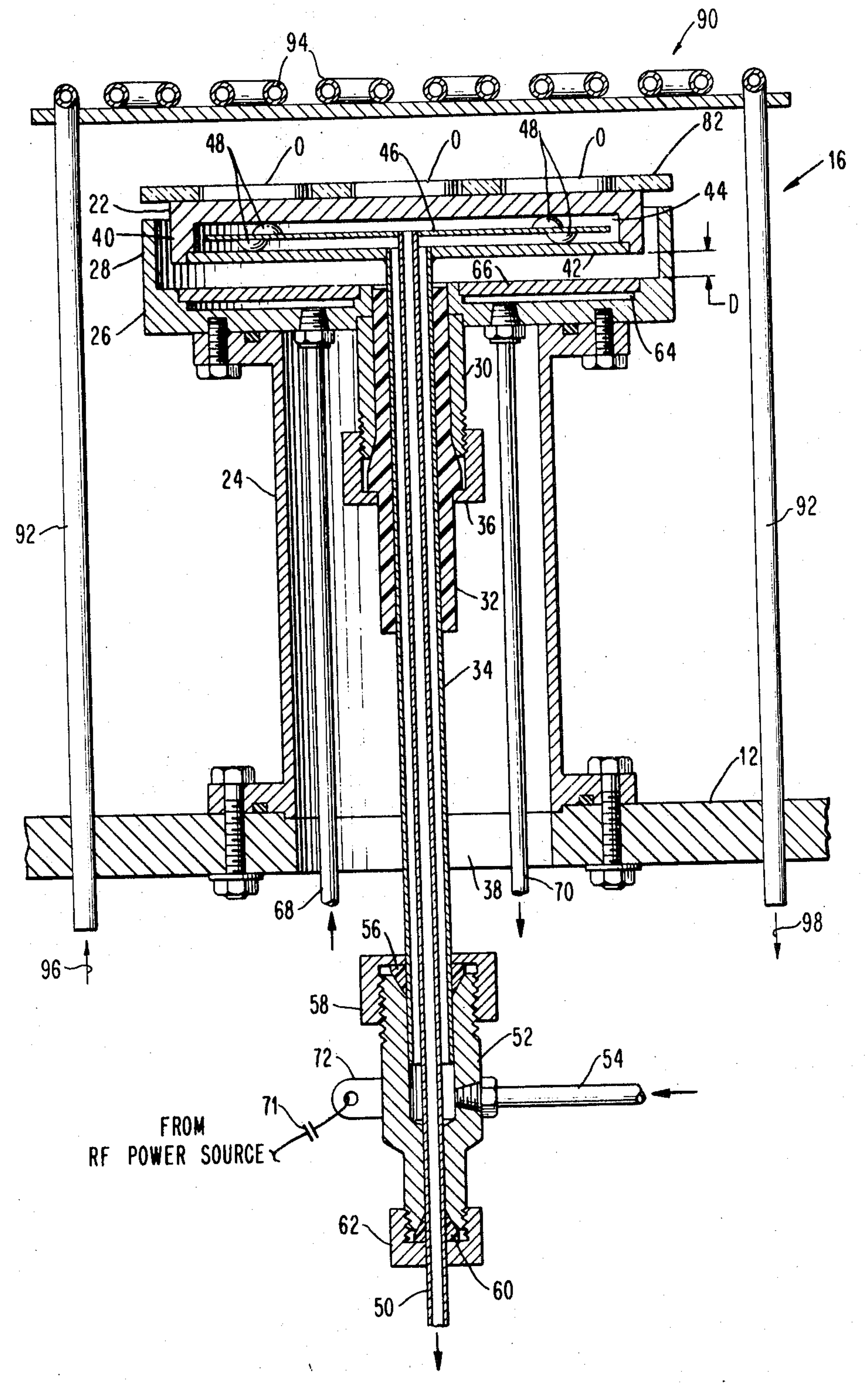
FIG. 2 is a vertical sectional view showing in greater detail the shielded electrode structure on which the object to be sputter etched is mounted.

Referring now to FIGS. 1 and 2, a low-pressure gas ionization chamber is enclosed by an envelope 10 in the form of a bell jar made of suitable material, such as Pyrex glass, which is removably mounted on a base plate 12. A gasket 11 is disposed between the jar 10 and metal plate 12 to provide a vacuum seal. A suitable gas such as argon, supplied by a source 13, is maintained at a desired low pressure of between about 1 to 8 microns of mercury in the enclosure by means of a vacuum pump 14. The superstructure 16 within the gas-filled enclosure serves as a cathode while metal plate 12 serves as an anode. The terms "cathode" and "anode" are employed merely for convenience herein inasmuch as the relative polarities of the plate 12 and the superstructure 16 will alternate while sputter etching is performed in accordance with the present invention. However, as shall be apparent hereinafter, this reversal of polarities does not effect a reversal of the sputtering operation.

Considering now the detailed construction of the cathode assembly 16 shown in FIG. 2, objects O to be sputter etched are mounted on a metal electrode 22. This electrode 22 is indirectly supported by, while being insulated from, a hollow supporting column or post 24, the bottom flanged portion of which is secured to the base plate 12. The post 24 is electrically conductive, and being in direct electrical contact with the base plate 12 (which is grounded as indicated in the drawings), the post 24 is maintained at ground potential. Supported on the upper flanged end of the cylindrical post 24 is a metallic shield 26 having an upwardly-extending annular lip portion 28 that partially encloses the electrode 22. A cylindrical metal sleeve 30 is secured to and extends from the lower face of the shield 26 in concentric relation to the cylindrical post 24, which encloses it. Within this sleeve 30 is disposed a narrower sleeve 32 of suitable insulating material, such as a polytetrafluoroethylene plastic, which extends upwardly into a central aperture in the shield member 26. A metal tube or pipe 34 extends vertically through the insulating sleeve 32 and is frictionally held in this vertical position by the sleeve 32. A ferrule or bushing 36 engaged with a projecting annular portion of the sleeve 32 is a screw-threaded onto the outer surface of the sleeve 30. With the ferrule 36 tightened, a firm frictional engagement is maintained among the parts 30, 32 and 34, whereby the tube 34 is effectively supported along the vertical axis of the post 24 while being electrically insulated therefrom. The lower portion of the tube 34 extends down through an opening 38 in the base plate 12 aligned with the interior space of the hollow post 24. The upper and lower flanges of the post 24 have airtight seals with the shield 26 and the base plate 12, respectively, and the insulating sleeve or gasket 32 maintains an airtight seal between the tube 34 and the shield 26. Hence, the interior of the post 24 is sealed from the space surorunding the post 24, which is part of the low-pressure gas chamber. The interior of the post 24 is at normal air pressure.

The electrode 22 is supported on the upper end of the vertical tube 34 as shown in FIG. 2. The electrode 22 is generally disc-shaped and has an annular, downwardly projecting portion 40 that seats upon a metal disc 42 secured to the upper end of the tube 34. The disc 42 and annular lip 40 are secured to each other for enclosing a central space 44, FIG. 2, within which ordinary tap water may be circulated to keep the temperature of the electrode 22 from rising too high while the apparatus is operating. To insure a uniform cooling action, a disc-shaped baffle member 46, FIG. 2, is disposed within the space 44, this baffle 46 being positioned therein by bosses 48 which engage the interior faces of the electrode 22 and the enclosing disc 42. The baffle 46 has a central opening that communicates with the upper end of a vertical tube 50 of small diameter that extends through the interior of the tube 34 in coaxial relation therewith. The lower end of the tube 34 extends into a metal bushing or sleeve 52, with which it has a tight fit. An inlet pipe 54, through which the tap water may flow, communicates with the interior of the bushing 52 and with the tube 34. A fluid-tight seal between the bushing 52 and the tube 34 is provided by means of a gasket 56 and a ferrule 58 threaded onto the bushing 52. The tube 50 extends entirely through the bushing 52 and serves as a return conduit for the cooling fluid which leaves the interior space 44 of the electrode 22. A gasket 60 and ferrule 62 threaded onto the lower end of the bushing 52 afford a fluid-tight seal between the tube 50 and the interior of the bushing 52. In operation, the tap water enters the outer tube 34 through the inlet pipe 54, is circulated around the baffle 46 within the space 44 inside the electrode 22, and then leaves through the exit tube 50, thereby cooling the electrode 22 and the objects O mounted thereon. The inlet pipe 54 and exit tube 50 are connected respectively to the faucet and drain by means of long plastic or rubber tubing. This creates a high resistance path to ground. With fifteen feet of ¼" I.D. tubing, a resistance to ground of about 10 megohms is obtained. With this arrangement, substantially no power is lost to ground.

Provisions also are made for cooling the shield 26. As shown in FIG. 2, an annular space 64 is provided within the shield 26. This space being closed by a disc 66 fitted into the shield 26. An inlet pipe 68 and outlet pipe 70 communicate with the space 64 for circulating tap water through this space and thereby cooling the shield 26. These inlet and outlet pipes 68 and 70 extend vertically through the opening 38 in the base plate 12 and are coupled at their upper ends to the shield 26.

An anode plate 90 maintained at the potential of plate 12 is preferably positioned closely adjacent to the objects O. The plate is mounted on support members 92 which are in turn mounted on plate 12. The anode plate 90 is cooled by provision of an internal cooling coil 94 or similar means. The inlet and outlet pipes 96 and 98 communicate with the coil 94 and water is passed through the pipes and coil to accomplish the cooling of the plate. The plate is preferably maintained at a temperature below that of the objects O so that the particles sputtered from the objects O will be deposited thereon rather than returning to other portions of the objects O. This reduces outgassing of adsorbed gases which can cause oxidation or other contamination of the objects O.

As shown in FIG. 1, voltage is applied to the electrode 22 from the radio-frequency power source 20. One side of the source 20 is grounded, and the other side thereof is connected through a capacitor 71 to a lug or terminal 72 on the bushing 52. The electrical connection is continued through the bushing 52 and the tube 34 to the electrode. As explained hereinabove, the tube 34 is electrically insulated from the shield 26. Ground potential is maintained on the shield 26 by virtue of the fact that this shield is electrically connected to the supporting post 24 which is mounted on the grounded base plate 12. The grounded shield 26 serves to suppress any glow discharge that otherwise might take place behind the target electrode 22. For proper operation of the shield, the space D between the shield 26 and the electrode 22 is chosen to fall within certain limits. It has been experimentally determined that for effective shielding this distance D should not be greater than the thickness of the Crookes dark space in the glow discharge. In addition, the shield 26 should be spaced far enough away from the electrode 22 to avoid an excessive capacitive coupling between the shield 26 and the electrode 22 at the radio frequency employed. The sputter etching is conducted at radio frequencies in the megacycle range. In this range the spacing D, between the shield 26 and the electrode 22 should not be less than about one-quarter inch.

Figure 3:
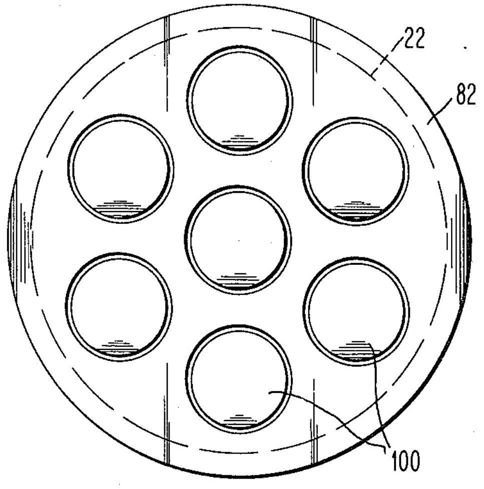
FIG. 3 is a plan view showing a typical arrangement of objects to be sputter etched.

An application for sputter etching according to the present invention is for the removal of residual oxide from chemically etched holes in an article. An arrangement for such an application is shown in FIG. 3. As shown, a number of objects O to be sputter etched are positioned on the electrode 22 through circular holes in a quartz, aluminum or similar material disc 82 which covers the electrode 22. Disc 82 is used to prevent sputtering of the metal electrode 22. However, the disc 82 is not absolutely necessary for sputter etching and can be eliminated. Where it is eliminated, the objects O are merely positioned in the same manner on the exposed surface of the metal electrode 22.

Figure 4:
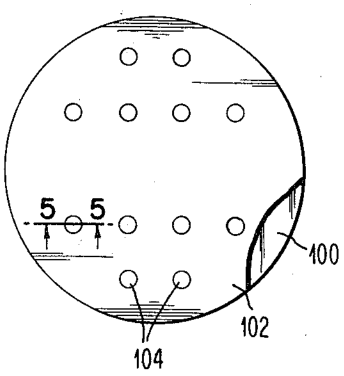
FIG. 4 is a plan view of one of the objects to be sputter etched.
Figure 5:
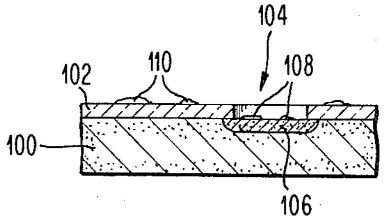
FIG. 5 is a sectional view schematically illustrating the residual material remaining on a portion of the object shown in FIG. 4 after chemical etching and prior to sputter etching.
Figure 6:
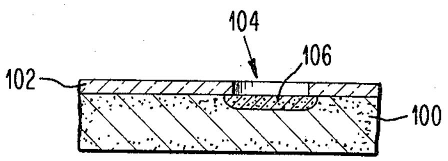
FIG. 6 is a sectional view illustrating the portion of the object of FIG. 5 following sputter etching.

FIGS. 4 and 5 show a silicon wafer 100 having, for example, an N-type impurity therein with a silicon dioxide dielectric coating 102 on its surface. Holes 104 in the dielectric layer have allowed for appropriate impurity diffusion into the semiconductor layer 100 to form regions 106 of, for example, P-type silicon within the wafer. The holes 104 were formed by the use of a conventional application of a photosensitive resist masking material, such as Kodak photo-resist film (KTFR), followed by photographically processing the photoresist coating to define the desired hole locations. The holes 104 were then etched in the oxide layer 102 using conventional etching solutions, such as hydrofluoric acid, or other suitable means so as to expose the upper surface of the silicon wafer 100. The excess photoresist masking material is then washed away by conventional washing procedure. The chemically etched holes 104 in the dielectric film 102 usually contain residual oxide 108 in or on the exposed semiconductor surface. Also, an oxide often forms on the semiconductor surface after the hole is opened and exposed to the atmosphere. When an ohmic contact is applied to the silicon wafer to complete the formation of the semiconductor device, the residual oxide areas 108 cause higher series resistance than is desirable. Also, residual portions 110 of the photoresist layer in many cases are not removed by the washing procedures. These residual quantities of photoresist are undesirable because it reduces the adhesion of metal films which are deposited after the sputter cleaning operation. All traces of the residual oxide 108 and residual photoresist 110 can be removed from the article by use of the present RF sputter cleaning method. FIG. 6 shows the article of FIG. 5 after sputter cleaning.

The pattern of chemically etched holes shown in FIG. 5 could not be etched by prior art techniques employing DC excitation because the positive charge that builds up around the objects O cannot be neutralized. The exposed semiconductor areas are not sufficiently large enough to discharge the charge accumulating on the objects O.

With the objects O positioned on the electrode 22 as described above, radio frequency energy is applied to the electrode 22 by the RF source 20 to perform the sputter etching. The sputter etching then takes place during those periods when the objects O are at a sufficiently negative potential with respect to the glow discharge. During the intervening period when the polarities of the electrodes are reversed, electrons are attracted to the target for removing the positive ion repelling charge therefrom.

Due to the fact that the electrons have far greater mobility than the ions there is a tendency at the RF frequency employed for many more electrons to flow toward the objects O than ions. However, inasmuch as there cannot be any net direct current flowing through the capacitor 71, the capacitor 71 will take on a charge and bias the objects O negatively to compensate for this tendency. In this negatively biased condition the objects O are positive for only a small portion of the positive half cycles of the excitation from the RF source 20.

In order to maintain a glow discharge around the objects O, the frequency of the applied voltage must be high enough so that the number of ions reaching the objects O during the negative half cycles is not sufficient to neutralize the described negative charge on the surface of the objects O. Furthermore, if the objects O were to acquire a substantial positive potential this would cause sputtering of the glass bell jar as well as undesirable sputtering of the metal parts associated with the plate 12 which normally functions as the anode. It has been found that a radio frequency excitation in the low megacycle range gives the best results. With the properly selected frequency and magnitude of applied voltage the sputtering action will be confined to the objects O and the cathode 22 will not become sufficiently positive at any time to produce a reverse sputtering because of the charge obtained by the capacitor 71.

The glow discharge maintained by the applied radio frequency excitation has the familiar characteristics of a direct current glow discharge including the existence of a Crookes dark space adjoining the RF cathode. Therefore establishment of a glow discharge at radio frequency between the objects O and the plate 12 causes a positive ion sheath to form around the objects O. As the objects O are bombarded by ions in the sheath, atomic particles of material are sputtered off the objects O. The residual oxide 108 and photoresist 110, together with small amounts of the dielectric layer 102 is sputtered away.

The vacuum maintained in the chamber must be adjusted within the range of about 1 to 8 microns of mercury, and preferably less than 5 microns of mercury, for the present invention to operate in its most ideal form. It has been found that pressures above this range promote the return of sputtered etched particles back to the sputtered etched areas, such as holes 104. However, at vacuums less than about 1 micron of mercury the glow discharge is difficult to sustain. Therefore, the use of this vacuum range plus anode plate 90 to take up the sputter eached particles, as described above in the present method provides the optimum procedure for RF sputter etching without the use of a mask. Below 5 microns of mercury the glow discharge might become somewhat unstable. The use of a magnetic field generated by, for example, a Helmholtz coil 99 gives a stable glow to about 1 micron pressure.

Figure 7:
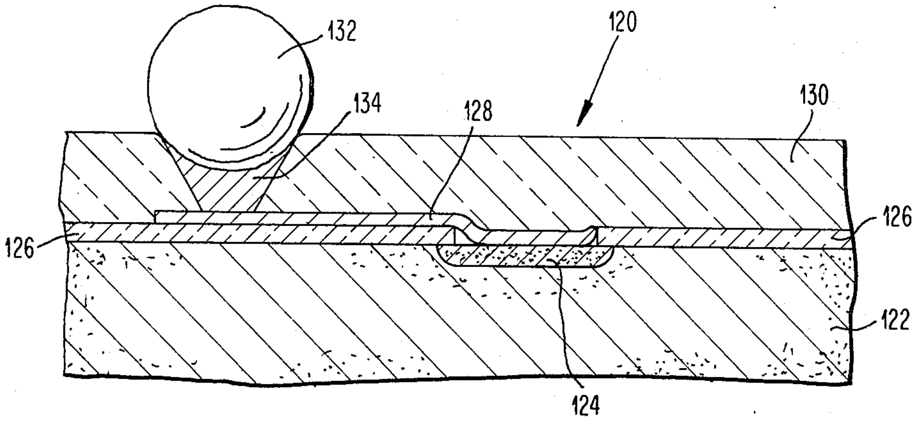
FIG. 7 is a sectional view of a semiconductor device which was sputter etched during its fabrication.

FIG. 7 shows a semiconductor device 120 which includes a silicon chip 122 having a PN junction 124 formed therein. A silicon dioxide layer 126 covers the chip 122. An aluminum silicon alloy area 128 forms the ohmic contact through a hole in the layer 126 to the silicon chip PN device. A borosilicate glass coating 130 covers the layer 126 and area 128. The second level external copper contact ball 132 is electrically and mechanically attached to the ohmic contact area 128, through a hole in the glass film 130, by means of a vacuum evaporated coating 134 of an alloy of chromium, copper and gold. The holes in the silicon dioxide film 126 and the hole in the glass film 130 are formed by first chemically etching and then sputter etching.

The following examples are included to merely aid in the understanding of the invention and variations may be made by one skilled in the art without departing from the spirit and scope of the invention.

EXAMPLES 1 THROUGH 8

The FIG. 7 device was fabricated up through chemically etching the hole in glass coating 130 for this purpose of this example. Seven of these devices were fabricated by identical procedures. These devices were each sputter etched in the chamber of FIG. 1 without the use of a magnetic field. The argon pressure of the chamber was maintained at about 18 microns of mercury. The walls of the chamber served as the collector for the removed materials. The base plate and top plate of the chamber served as the electrical ground for the system. The etching time, the power applied, the glass removed and the resulting contact resistance between the subsequently applied chromium-copper-gold alloy coating 134 and the film 128 are given for each of the examples in Table I. The resistance was measured using the known 4 point probe resistance measurement technique.

TABLE I.—MODE I OPERATION

| Examples | Time (in min.) | Power (in watts) | Glass removal (in A.) | Mean contact resistance (m. ohms) |
|---|---|---|---|---|
| 1 | 12.5 | 250 | 460 | 250 |
| 2 | 12.5 | 250 | 410 | 400 |
| 3 | 23 | 250 | 630 | 400 |
| 4 | 30 | 250 | 930 | 100 |
| 5 | 40 | 250 | 1,280 | 450 |
| 6 | 100 | 250 | 4,980 | 600 |
| 7 | 50 | 250 | 2,150 | 530 |

EXAMPLES 8 THROUGH 11

Five of the FIG. 7 devices were fabricated by the identical procedure as in Examples 1 through 7. The sputter etching conditions were the same as in Examples 1 through 7 procedure with the exceptions that (1) the argon pressure was about 2 microns of mercury, (2) a magnetic field was produced in the area of the sputter etching by means of two permanent magnets, with poles facing each other position, on top of the plate 90 and (3) the plate 90 was positioned one inch away from the plane of the object to be etched. The variables and results are given in Table II.

TABLE II.—MODE II OPERATION

| Examples | Time (in min.) | Power (in watts) | Glass removal (in A.) | Mean contact resistance (m. ohms) |
|---|---|---|---|---|
| 8 | 10 | 250 | 1,242 | 30 |
| 9 | 20 | 125 | 995 | 55 |
| 10 | 20 | 125 | 1,259 | 11, 19 |
| 11 | 20 | 125 | 1,450 | 29, 16 |

The acceptable maximum contact resistance is 100 m. ohms. The Examples 1 through 7 resulting contact resistances are all substantially greater than this maximum. The Examples 8 through 11 devices were all well within the acceptable range. It is postulated that the high contact resistances in Examples 1 through 7 were due to the "back scattering" of glass particles sputtered from the surface of the glass coated device. The use of the low pressure and anode plate 90 solved this problem.

The above embodiments of this invention have been described in connection with particular applications. Of course, there are many other applications of this invention. However, in all these applications it is important that the RF frequency be sufficiently high to cause more electrons than ions to gravitate towards objects O and that some capacitance be inserted in the circuit coupling of the RF energy to bias the objects O at a negative potential. In the described embodiment the separate capacitor 71 was added to provide the necessary capacitance but other means may be employed. For instance, if a dielectric material is to be sputter etched that material can function as the capacitive coupling for the RF source. Copending applications Ser. No. 428,733, filed Jan. 28, 1965 now U.S. Patent 3,369,991 (IBM Docket 14, 108); Ser. No. 514,853 filed Dec. 20, 1965 now U.S. Patent 3,525,680 (IBM Docket 14, 123); Ser. No. 514,827, filed Dec. 20, 1965 now abandoned (IBM Docket 14, 422) and Ser. No. 520,131, filed Jan. 12, 1966 (IBM Docket 14, 175) cover related subject matter and are assigned to the same assignee as the present application.

Therefore, while the invention has been particularly shown and described with reference to a preferred embodiment thereof, it will be understood by those skilled in the art that various changes in form and detail may be made therein without departing from the spirit and scope of the invention.

What is claimed is:

1. A method for forming a metallic oxide insulative mask on a substrate surface comprising:

forming a metallic oxide layer on the surface;

selectively removing portions of the layer by chemical etching to expose portions of the surface;

placing the substrate in an atmosphere composed essentially of an inert gas at a pressure between about one and eight microns of mercury; and generating a plasma and exciting the article, through a capacitive coupling with an alternating RF potential of a sufficiently large magnitude to cause the residual metallic oxide in said exposed portions to be sputter etched by a bombardment of the ions of the inert gas and of a sufficiently high RF frequency to cause a charge to build up across the capacitive coupling to bias the said article at a negative DC potential.

2. The method of claim 1 wherein said residual oxide is silicon dioxide and said surface is a semiconductor.

3. The method of claim 2 wherein the semiconductor is silicon.

4. The method of claim 3 wherein said pressure is between about 1 and 5 microns of mercury.

5. The method of claim 1 wherein an anode plate is provided closely adjacent to said substrate to pick up the sputter etched particles removed from the substrate.

References Cited

UNITED STATES PATENTS 3,233,137 2/1966 Anderson et al. ...... 204—192
3,271,286 9/1966 Lepselter ............ 204—192
3,377,263 4/1968 Springer, Jr. ........ 204—143
3,391,071 7/1968 Theuerer ............. 204—192

OTHER REFERENCES

Anderson et al., "Sputtering of Dielectrics by High-Frequency Fields," Journal of Applied Physics, vol. 33, No. 10, October 1962, pp. 2991–2.

JOHN H. MACK, Primary Examiner

N. A. KAPLAN, Assistant Examiner

U.S. Cl. X.R.

204—298